United States Patent
Shirasaki (10) Patent No.: US 12,136,598 B2
(45) Date of Patent: Nov. 5, 2024

(54) LID, ELECTRONIC COMPONENT-HOUSING PACKAGE, AND ELECTRONIC DEVICE

(71) Applicant: KYOCERA Corporation, Kyoto (JP)

(72) Inventor: Takayuki Shirasaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 288 days.

(21) Appl. No.: 17/772,599

(22) PCT Filed: Oct. 26, 2020

(86) PCT No.: PCT/JP2020/040105
§ 371 (c)(1),
(2) Date: Apr. 28, 2022

(87) PCT Pub. No.: WO2021/085378
PCT Pub. Date: May 6, 2021

(65) Prior Publication Data
US 2022/0406727 A1    Dec. 22, 2022

(30) Foreign Application Priority Data

Oct. 29, 2019  (JP) .................... 2019-195746
Oct. 31, 2019  (JP) .................... 2019-198478

(51) Int. Cl.
*H01L 23/552* (2006.01)

(52) U.S. Cl.
CPC .................. *H01L 23/552* (2013.01)

(58) Field of Classification Search
None
See application file for complete search history.

(56) References Cited

U.S. PATENT DOCUMENTS

| 4,376,938 | A | * | 3/1983 | Toth | H01Q 13/206 |
| | | | | | 343/700 MS |
| 4,906,801 | A | * | 3/1990 | Beasley | H01F 27/02 |
| | | | | | 336/105 |
| 5,313,371 | A | * | 5/1994 | Knecht | H05K 9/0039 |
| | | | | | 29/25.35 |
| 5,539,151 | A | * | 7/1996 | Hamzehdoost | H01L 23/10 |
| | | | | | 257/710 |
| 6,229,085 | B1 | * | 5/2001 | Gotoh | H01J 11/10 |
| | | | | | 313/134 |
| 6,262,364 | B1 | * | 7/2001 | Yoshikawa | H01J 11/10 |
| | | | | | 174/394 |

(Continued)

FOREIGN PATENT DOCUMENTS

| EP | 3907070 A1 * 11/2021 | ............. B32B 15/02 |
| JP | 2002231843 A * 8/2002 | |

(Continued)

*Primary Examiner* — Krystal Robinson
(74) *Attorney, Agent, or Firm* — Volpe Koenig (57) ABSTRACT

Provided is a lid of an electronic component-housing package. The lid includes a conductor layer and a dielectric layer. The conductor layer includes at least one opening and a first part surrounding the at least one opening. The dielectric layer includes a second part, a first dielectric layer, and a second dielectric layer. The second part is located in the at least one opening. The first dielectric layer lies on the top of the conductor layer. The second part lies on the underside of the conductor layer.

19 Claims, 4 Drawing Sheets

(56) References Cited

U.S. PATENT DOCUMENTS

| | | | | |
|---|---|---|---|---|
| 6,504,095 | B1* | 1/2003 | Hoffstrom | H05K 5/0091 |
| | | | | 361/692 |
| 2004/0231879 | A1* | 11/2004 | Ebihara | H01L 23/552 |
| | | | | 174/532 |
| 2007/0190858 | A1* | 8/2007 | Stoneham | H05K 9/0031 |
| | | | | 439/607.01 |
| 2013/0228365 | A1* | 9/2013 | Uprety | H05K 1/0353 |
| | | | | 156/60 |
| 2015/0327003 | A1* | 11/2015 | Dobyns | H04W 24/08 |
| | | | | 455/41.1 |
| 2017/0295643 | A1* | 10/2017 | Suzuki | H01L 23/552 |

FOREIGN PATENT DOCUMENTS

| | | | |
|---|---|---|---|
| JP | 2004087953 A | * | 3/2004 |
| JP | 2005-051112 A | | 2/2005 |
| JP | 2008-244475 A | | 10/2008 |
| JP | 2017-191835 A | | 10/2017 |
| JP | 2017191835 | * | 10/2017 |
| WO | 2006/059556 A1 | | 6/2006 |

\* cited by examiner

LID, ELECTRONIC COMPONENT-HOUSING PACKAGE, AND ELECTRONIC DEVICE

TECHNICAL FIELD

The present disclosure relates to a lid, an electronic component-housing package, and an electronic device.

BACKGROUND ART

Electronic components such as semiconductor elements and piezoelectric elements may be housed in known electronic component-housing packages, some of which include lids each provided with an electrical resistance layer capable of absorbing radio waves to suppress outward spurious emission (see, for example, Japanese Unexamined Patent Application Publication No. 2005-51112).

Such an electronic component can be influenced in terms of its operating frequency by the electrical resistance layer of the lid, depending on the position of the electrical resistance layer. As a workaround, the physical distance between the electronic component and the electrical resistance layer may be increased, in which case the size of the electronic component may be increased correspondingly.

SUMMARY OF INVENTION

A lid according to the present disclosure is a lid of an electronic component-housing package. The lid includes a conductor layer and a dielectric layer. The conductor layer includes at least one opening and a first part surrounding the at least one opening. The dielectric layer includes a second part, a first dielectric layer, and a second dielectric layer. The second part is located in the at least one opening. The first dielectric layer lies on the top of the conductor layer. The second dielectric layer lies on the underside of the conductor layer.

An electronic component-housing package according to the present disclosure includes the lid and an electronic component-housing base. The electronic component-housing base includes a mounting part and an upper surface peripheral portion for joining with a lower surface peripheral portion of the lid. The mounting part is a mounting place for an electronic component and is surrounded with the upper surface peripheral portion.

An electronic device according to the present disclosure includes the electronic component-housing package and an electronic component mounted on the mounting part.

DESCRIPTION OF EMBODIMENTS

Hereinafter, embodiments of the present disclosure will be described with reference to the accompanying drawings. One of two opposite surfaces of a lid faces the inside of an electronic component-housing package and is herein referred to as a lower surface. The reverse surface of the lid faces the outside of the electronic component-housing package and is herein referred to as an upper surface. The terms "upper" and "lower" herein do not imply the up-and-down direction of the lid, the electronic component-housing package, and an electronic device that are in use. The term "thickness" used in relation to layers described in the following embodiments refers to the dimension of each layer in a cross section orthogonal to the upper surface of the lid and in the direction orthogonal to the upper surface. In a case where a structure other than a first dielectric layer is included in an upper part of the lid, the upper surface refers to an upper surface of the first dielectric layer alone (exclusive of the structure disposed thereon).

Embodiment 1

Figure 1:
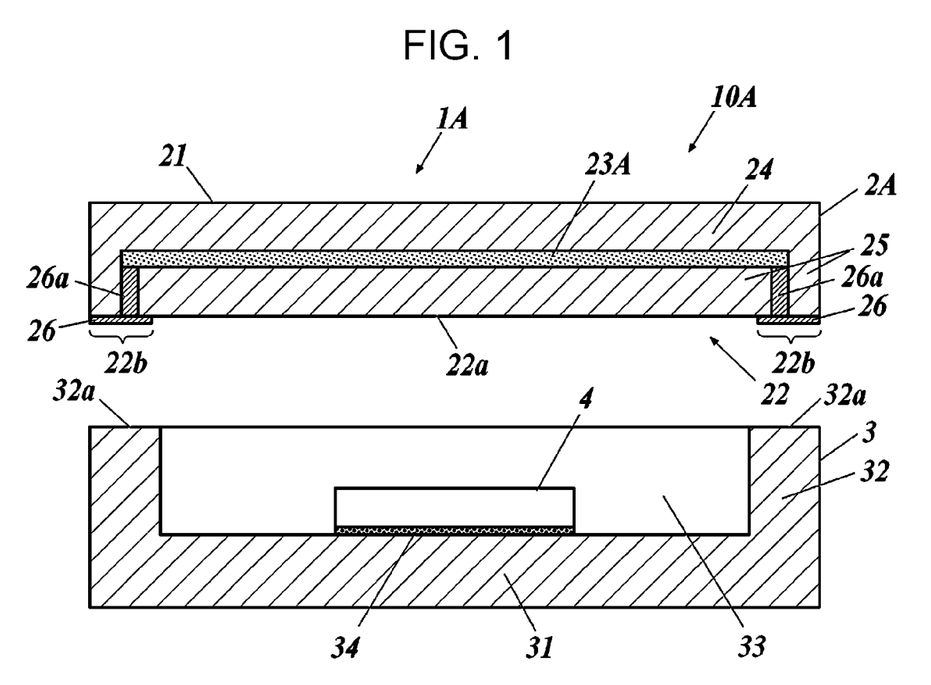
FIG. 1 is a longitudinal sectional view of an electronic device according to Embodiment 1 of the present disclosure, illustrating a state in which a lid is detached.

Referring to FIG. 1, an electronic component-housing package 1A according to Embodiment 1 includes a lid 2A and an electronic component-housing base 3.

The lid 2A is in the form of a flat plate and has an upper surface 21 and a lower surface 22. The lower surface 22 includes a middle surface 22a and a lower surface peripheral portion. The middle surface 22a is an inner surface of the package. The lower surface peripheral portion includes a seal area 22b, which extends along at least part of the periphery of the middle surface 22a. The seal area 22b is an area for joining with the electronic component-housing base 3, which will be described later.

The electronic component-housing base 3 is in the form of a receptacle and includes a bottom surface portion 31 and a peripheral wall portion 32, with which a housing space 33 is defined. A mounting part 34 is located on an upper surface of the electronic component-housing base 3 inside the housing space 33 surrounded by the peripheral wall portion 32. The mounting part is a mounting place for an electronic component 4. The electronic component-housing base 3 includes a predetermined wiring pattern for electrodes extended from the electronic component 4.

An upper end face of the peripheral wall portion 32 is an upper surface peripheral portion 32a for joining with the seal area 22b of the lid 2A.

The electronic component 4 is mounted onto the mounting part 34, and the upper surface peripheral portion 32a of the electronic component-housing base 3 and the seal area 22b of the lid 2A are then joined together with, for example, a brazing material such that the electronic component 4 is hermetically sealed in the housing space 33. The electronic component is packaged in this manner to provide an electronic device 10A.

The lid 2A and the electronic component-housing base 3 each include an insulating substrate that is a dielectric made of a ceramic material, such as sintered aluminum oxide (alumina ceramics), sintered aluminum nitride, sintered mullite, or sintered glass-ceramics.

The lid 2A of the electronic component-housing package 1A includes an electrical resistance layer 23A and dielectric layers or, more specifically, a first dielectric layer 24 and a second dielectric layer 25. The electrical resistance layer 23A is a conductor layer. The first dielectric layer 24 and the second dielectric layer 25 lie on the top and the underside, respectively, of the electrical resistance layer 23A (i.e., on the outer side and the inner side, respectively, of the package).

The first dielectric layer 24 lies on the top of the electrical resistance layer 23A, with the upper surface 21 being a surface of the first dielectric layer 24. The second dielectric layer 25 lies on the underside the electrical resistance layer 23A, with the lower surface 22 being a surface of the second dielectric layer 25.

The second dielectric layer 25 lying on the underside of the electrical resistance layer 23A has an advantage over a radio wave absorber on a lower surface of a lid in the following respect: the physical distance between the electrical resistance layer 23A and the electronic component 4 is increased such that the electronic component 4 is less influenced in terms of its operating frequency by the electrical resistance layer 23A, and as a result, the electronic component 4 can operate in a stable manner.

The electrical resistance layer 23A eliminates or reduces the occurrence of cavity resonance or, more specifically, resonant oscillation in the housing space 33 such that outward spurious emission is suppressed.

The electrical resistance layer 23A includes openings 23Ah and a first part 23Ac, which surrounds the individual openings 23Ah. The first part 23Ac is preferably linear. The term "linear" is herein used to describe strips or any other shape longer in one direction than in another direction; that is, the width (i.e., the dimension in the short-side direction) is greater than the length (i.e., the dimension in the longitudinal direction). The term "linear" herein does not necessarily refer to the shape of straight lines. A dielectric layer includes a second part 27A, the first dielectric layer 24, and the second dielectric layer 25. The second part 27A is located in the openings 23Ah. The second part 27A and the first dielectric layer 24 extend continuously in a manner so as to constitute a single piece. More specifically, the second part 27A, that is, part of the first dielectric layer 24 or part of the second dielectric layer 25 is caught in the openings 23Ah of the electrical resistance layer 23A when the electrical resistance layer 23A and the dielectric layer concerned (the first dielectric layer 24 or the second dielectric layer 25) are stacked.

Figure 2:
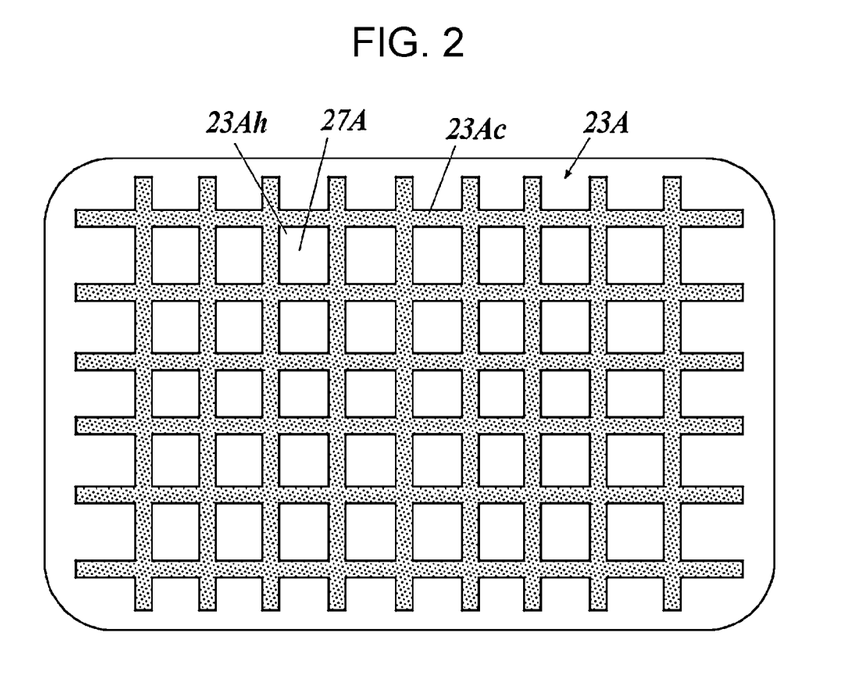
FIG. 2 is a plan view of a layer included in the lid, with an electrical resistance layer in FIG. 1 being located in the layer.
Figure 3:
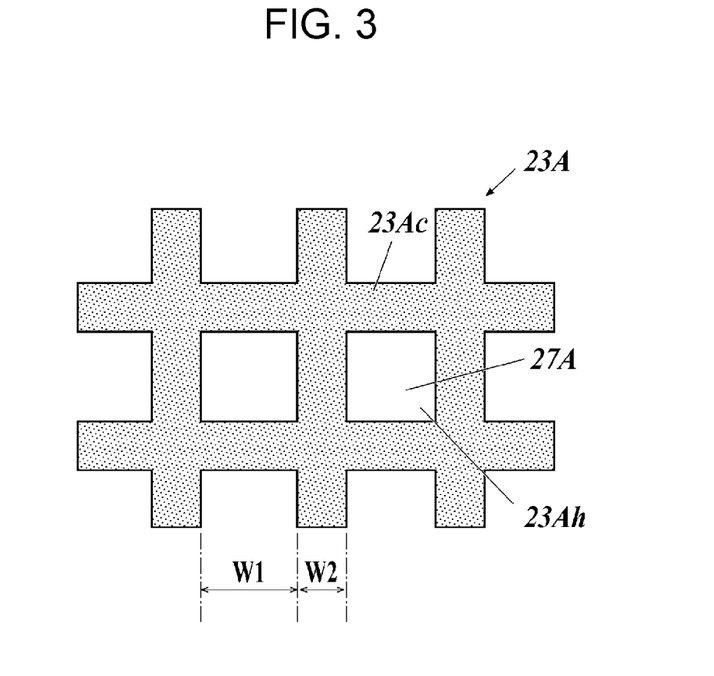
FIG. 3 is a partial enlargement of FIG. 2.

As illustrated in FIGS. 2 and 3, which are see-through plan views, the electrical resistance layer 23A may include two openings 23Ah or a mesh of multiple openings 23Ah that are small in size. In the case where such a mesh pattern is formed, the openings 23Ah may be arranged at a regular distance from each other. The openings 23Ah each may be rectangular or circular when viewed in plan.

In the case where the openings 23Ah each have a rectangular shape, the width of each opening 23Ah is the length of at least each of the long sides of the rectangular shape. In the case where the openings 23Ah each have a circular shape, the width of each opening 23Ah is the diameter of the circular shape. In the case where the openings 23Ah each have an elliptical shape, the width of each opening 23Ah is the length of the direct axis of the elliptical shape. The width of each opening 23Ah is herein referred to as an opening width, which will be described later in detail. The openings 23Ah may have other shapes, in which case the opening width is the maximum width of the shape concerned.

Spurious waves can arise from radio waves in the operating frequency of the electronic component, and the resultant outward spurious emission can produce adverse effects. This would be a problem in need of addressing. A typical workaround to this problem is to attach a radio wave absorber to the lid so as to absorb radio waves of certain frequencies that will be a cause of outward spurious emission. There is nevertheless some concern that such a radio wave absorber would involve extra cost and would affect the operation of the electronic component. Placing a resistor inside the lid advantageously reduces the possibility that spurious waves will arise from radio waves in the operating frequency of the electronic component and that the resultant outward spurious emission will produce adverse effects.

W1 denotes the opening width of the mesh in the electrical resistance layer 23A and is less than or equal to $\lambda/4$, where $\lambda$ is the radio wavelength at which the electronic component 4 operates. The line width of the first part 23Ac of the electrical resistance layer is herein referred to as a mesh line width. The opening width of the mesh is the spatial distance between adjacent mesh line widths. The mesh pattern of the electrical resistance layer 23A may be designed such that the opening width W1 of the mesh is more than zero and less than or equal to $\lambda/4$, in which case outward spurious emission will be reduced to a satisfactory degree. The radio wavelength at which the electronic component operates refers to the effective wavelength corresponding to the frequency that coincides with the operating frequency of the electronic component. The same applies hereinafter. The term "line width" refers to the extent to which an object viewed in plan extends in a direction orthogonal to its longitudinal direction.

The thickness of the second dielectric layer 25 lying on the underside of the electrical resistance layer 23A is more than $\lambda/16$ and less than or equal to $\lambda/4$, where $\lambda$ is the radio wavelength at which the electronic component 4 operates. The occurrence of dielectric resonance inside the lid 2A will be reduced accordingly. In the case where the thickness of the second dielectric layer 25 is more than or equal to $\lambda/16$, the electronic component is less affected in terms of its operating frequency by the electrical resistance layer 23A, and a standing wave is less likely to develop in the lid 2A.

Likewise, the thickness of the first dielectric layer 24 lying on the top of the electrical resistance layer 23A is more than $\lambda/16$ and less than or equal to $\lambda/4$, where $\lambda$ is the radio wavelength at which the electronic component 4 operates. The occurrence of dielectric resonance inside the lid 2A will be further reduced accordingly. In the case where the thickness of the first dielectric layer 24 is more than or equal to $\lambda/16$, a certain level of resistance to mechanical pressure from the outside is maintained, and a standing wave is less likely to develop in the lid 2A. When the need to increase the thickness of the lid 2A arises, the thickness of the dielectric layers may be adjusted as follows: the thickness of the second dielectric layer 25, which is located on the underside in a manner so as to be physically closer than the other dielectric layer to the electronic component and can thus influence the electronic component significantly, is more than $\lambda/16$ and less than or equal to $\lambda/4$, and the first dielectric layer 24 is thicker than the second dielectric layer 25. The thickness of the first dielectric layer 24 may be more than $\lambda/4$.

Figure 4:
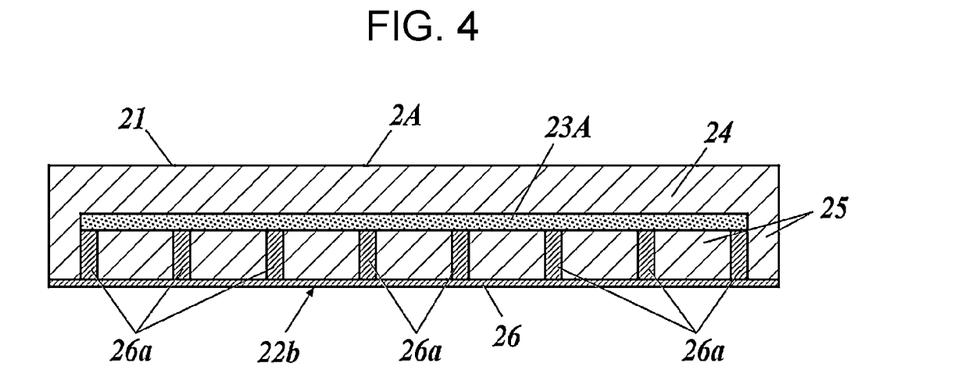
FIG. 4 is a longitudinal sectional view of a peripheral portion of the lid according to Embodiment 1 of the present disclosure.

The second dielectric layer 25 includes a contact conductor 26, which is connected to the first part 23Ac of the electrical resistance layer 23A and extends in the up-and-down direction. The contact conductor 26 may be made of an electrically conductive material, such as tungsten. The contact conductor 26 may be a via for conduction of electricity between an upper layer and a lower layer. The contact conductor (metal film) 26 electrically connected to the electrical resistance layer 23A is exposed at a surface of the lid 2A. In Embodiment 1, the contact conductor 26 is exposed at the seal area 22b in the lower surface peripheral portion of the lid 2A. As illustrated in FIG. 4, the contact conductor 26 includes through portions 26a, which extend through the second dielectric layer 25. More than one through portion 26a may be provided in a manner so as to be located in the seal area 22b in the lower surface peripheral portion when viewed in the up-and-down direction, with a spacing of λ/4 or less being provided between adjacent ones of the through portions 26a. This layout enables the lid 2A to produce an improved shielding effect, which in turn reduces spurious emission. A metal film electrically connected to ground wiring is placed on the upper surface peripheral portion 32a of the electronic component-housing base 3. The lid 2A is brazed to the electronic component-housing base 3 such that the electrical resistance layer 23A is electrically connected to the ground wiring of the electronic component-housing base 3.

While the electronic device 10A is in operation, the electrical resistance layer 23A is electrically connected to the ground such that spurious wave absorbed in the electrical resistance layer 23A are allowed to escape to the ground. The constancy of radio-frequency characteristics is achieved accordingly.

The first part 23Ac of the electrical resistance layer 23A may be made of ruthenium oxide ($RuO_2$).

The sheet resistance of the first part 23Ac of the electrical resistance layer 23A may be in a range of about 20 to 100 Ω/sq. A base-metal resistive paste, such as a tungsten (W) paste and a Cu—Ni paste, may be used in place of ruthenium oxide. The electrical resistance layer 23A may be made of a mixture of carbon and a metallic material, such as ruthenium oxide. Carbon contained in the material enables an increase in the resistivity of the layer. The first part 23Ac having a mesh pattern is advantageous in that the resistance is higher than if the first part 23Ac of the electrical resistance layer 23A is a solid film. For example, the apparent overall resistance of the electrical resistance layer 23A made of an electrically resistive material having a sheet resistance of about 3 Ω/sq is as high as about 20 Ω/sq when W2 is 150 μm and W1 is 850 μm, where W2 denotes the line width of the first part 23Ac of the electrical resistance layer 23A, and W1 denotes the width of each opening 23Ah. If the width of each opening 23Ah is too small, an electric field would stay in the openings 23Ah and would produce adverse effects. Each opening 23Ah preferably has any desired width greater than the line width of the first part 23Ac, that is, greater than the line width W2 of the first part 23Ac. Owing to the mesh structure, the sheet resistance of the electrical resistance layer 23A, which originally has a sheet resistance of about 3 Ω/sq, is as high as about 20 to 100 Ω/sq, and the rate of absorption of spurious waves in the electrical resistance layer is improved accordingly. These features enable a reduction in the level of outward spurious emission and an improvement in the rate of absorption of spurious waves in the lid. It is not required that the openings 23Ah of the mesh structure each be square when viewed in plan. As mentioned above, the openings 23Ah each may be rectangular or circular when viewed in plan. The line width of the first part 23Ac may be constant or may be varied. For example, the line width of the first part 23Ac is varied in such a manner that a vertically extending portion and a horizontally extending portion that intersect at right angles have different widths or in such a manner that the horizontally extending portion and another horizontally extending portion have different widths.

The adoption of the lid 2A in Embodiment 1 offers the following advantages: outward spurious emission and dielectric resonance inside the lid 2A are suppressed; and the electronic component 4 can operate in a stable manner, with the lid 2A having little influence on the electronic component 4.

The electrical resistance layer 23A is overlaid with the first dielectric layer 24 and the second dielectric layer 25 and is held inside the lid 2A such that the electrical resistance layer 23A is protected from damage, erosion, and the like. Thus, selections can be made from a variety of conductor materials for the electrical resistance layer 23A. Furthermore, a mesh structure adopted as the electrical resistance layer 23A is less susceptible to breakage.

The width of each opening 23Ah, that is, the opening width W1 of the mesh and the line width W2 of the first part 23Ac of the mesh may be varied to increase or reduce the sheet resistance of the electrical resistance layer 23A, with no variations in the material of the mesh structure adopted as the electrical resistance layer 23A.

It can thus be easily ensured that the lid has favorable characteristics in relation to radio waves. For example, the lid has the aforementioned ability to prevent or reduce the occurrence of resonance.

Method for Manufacturing Electronic Component-Housing Package and Electronic Component-Housing Base The following describes a method for manufacturing the electronic component-housing package 1A according to Embodiment 1 of the present disclosure. The lid 2A and the electronic component-housing base 3 are formed separately by following the procedure below.

Amounting substrate or, more specifically, the bottom surface portion 31 of the electronic component-housing base 3 may be made of sintered aluminum oxide in the following manner. First, raw materials (e.g., aluminum oxide and silicon oxide) in powder form, a desired organic binder, and an organic solvent are mixed together to obtain a sheet, which is then formed into rectangular ceramic green sheets. The ceramic green sheets are then stacked on top of one another to obtain a multilayer body. It is not required that two or more ceramic green sheets be stacked to obtain a multilayer body. The mounting substrate may be a monolayer that would not be a cause for concern about, for example, mechanical strength. The ceramic green sheets are then fired at temperatures in the range of 1,300 to 1,600° C. such that the ceramic green sheets are formed into a mounting substrate.

A frame or, more specifically, the peripheral wall portion 32 may be made of sintered aluminum oxide, in which case the frame can be formed in much the same way as the mounting substrate. First, raw materials (e.g., aluminum oxide and silicon oxide) in powder form, a desired organic binder, and an organic solvent are mixed together to obtain a sheet, which is then formed into rectangular ceramic green sheets. The ceramic green sheets are then stacked on top of one another to obtain a multilayer body. A through-hole is formed in the midsection of the multilayer body by stamping such that the multilayer body is formed into the shape of a frame. Subsequently, a metal layer is formed on the multilayer body by, for example, screen printing, where a metal paste that is a mixture of tungsten in powder form, an organic solvent, and an organic binder is applied on an upper surface of the multilayer body. The multilayer body is then fired at temperatures in the range of 1,300 to 1,600° C. such that the multilayer body is formed into a frame. It is not required that two or more ceramic green sheets be stacked to obtain a frame. The frame may be a monolayer that would not be a cause for concern about, for example, the mechanical strength required of the frame. The frame is bonded to an upper surface of the mounting substrate with a bonding material, such as a glass bonding material or a resin bonding material. As with the mounting substrate, the frame may be made of sintered aluminum oxide, in which case a stack of ceramic green sheets having the shape of a frame is laid on an upper surface of a stack of ceramic green sheets for forming a mounting substrate, and these ceramic green sheets are fired all at once such that a frame and a mounting substrate are fabricated as a single piece.

The lid 2A may be made of sintered aluminum oxide in the following manner. First, raw materials (e.g., aluminum oxide and silicon oxide) in powder form, a desired organic binder, and an organic solvent are mixed together to obtain a sheet, which is then formed into rectangular ceramic green sheets.

The electrical resistance layer 23A is formed by the following procedure: an electrically resistive material is applied to a surface of one of the ceramic green sheets that is going to be formed into the first dielectric layer 24 or the second dielectric layer 25. Then, through portions extending from one surface to the other surface are formed and are filled with a filling material, which may be compositionally identical to the electrically resistive material or may be tungsten or any other material that conducts electricity well. The through portions filled with the filing material will constitute the contact conductor 26. The structure obtained as above is overlaid with a ceramic green sheet that is going to be formed into the other dielectric layer (the first dielectric layer 24 or the second dielectric layer 25). These layered sheets constitute a multilayer body.

Then, through portions are formed in the ceramic layer that is going to be formed into the second dielectric layer 25. The through portions extend through the ceramic layer in such a manner that one end of each through portion is exposed at the seal area 22b and the other end of each through portion is connected to the electrical resistance layer 23A. A metal film is applied to the inside of each through portion and the seal area 22b such that the contact conductor 26 electrically connected to the electrical resistance layer 23A is formed. The multilayer body is then fired at temperatures in the range of 1,300 to 1,600° C. and is formed into the lid 2A.

Embodiment 2

Figure 5:
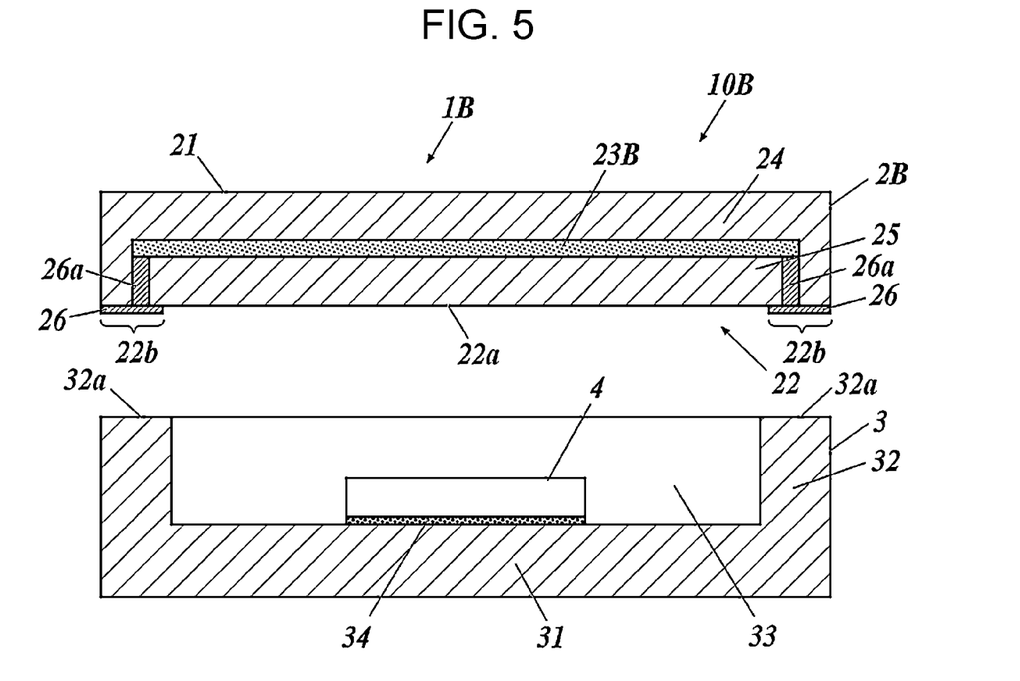
FIG. 5 is a longitudinal sectional view of an electronic device according to Embodiment 2 of the present disclosure, illustrating a state in which a lid is detached.
Figure 6:
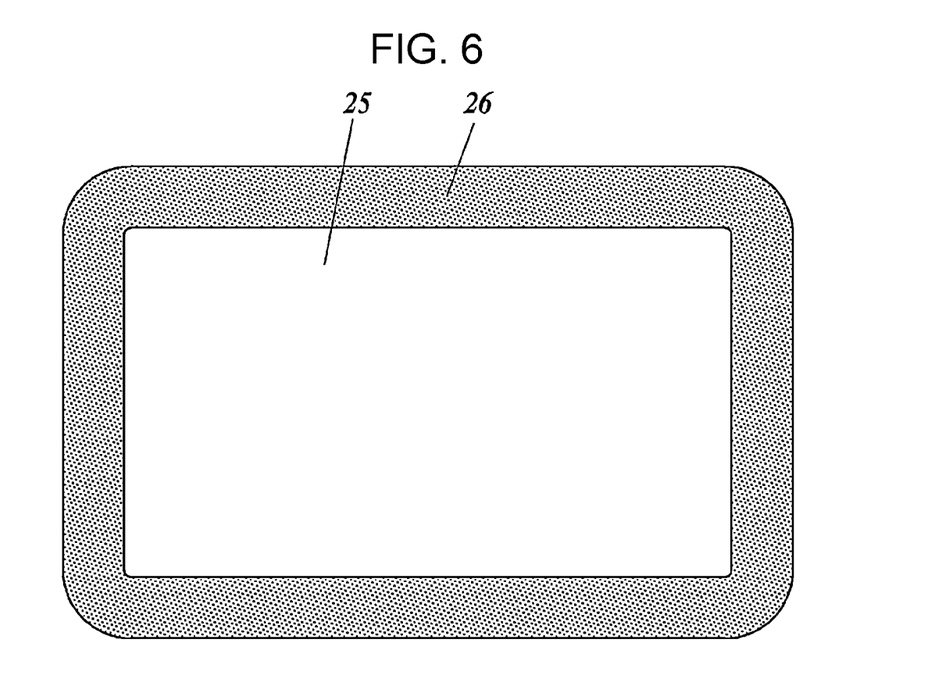
FIG. 6 is a plan view of a lower surface (an inner side surface) of the lid of the electronic device in FIG. 1.

Referring to FIG. 5, an electronic component-housing package 1B according to Embodiment 2 includes a lid 2B and an electronic component-housing base 3.

The lid 2B is in the form of a flat plate and has an upper surface 21 and a lower surface 22. The lower surface 22 includes a middle surface 22a and a lower surface peripheral portion. The middle surface 22a is an inner surface of the package. The lower surface peripheral portion includes a seal area 22b, which extends along at least part of the periphery of the middle surface 22a.

The electronic component-housing base 3 in the present embodiment is identical to the electronic component-housing base 3 in Embodiment 1. An upper end face of a peripheral wall portion 32 of the electronic component-housing base 3 is an upper surface peripheral portion 32a for joining with the seal area 22b of the lid 2B.

An electronic component 4 is mounted onto a mounting part 34, and the upper surface peripheral portion 32a of the electronic component-housing base 3 and the seal area 22b of the lid 2B are then joined together with, for example, a brazing material such that the electronic component 4 is hermetically sealed in a housing space 33. The electronic component is packaged in this manner to provide an electronic device 10B.

The lid 2B and the electronic component-housing base 3 each include an insulating substrate that is a dielectric compositionally identical to the dielectric in Embodiment 1.

The lid 2B of the electronic component-housing package 1B includes a conductor layer 23B and dielectric layers or, more specifically, a first dielectric layer 24 and a second dielectric layer 25. The first dielectric layer 24 and the second dielectric layer 25 lie on the top and the underside, respectively, of the conductor layer 23B (i.e., on the outer side and the inner side, respectively, of the package).

The first dielectric layer 24 lies on the top of the conductor layer 23B, with the upper surface 21 being a surface of the first dielectric layer 24. The second dielectric layer 25 lies on the underside the conductor layer 23B, with the lower surface 22 being a surface of the second dielectric layer 25.

The second dielectric layer 25 lying on the underside of the conductor layer 23B has an advantage over a radio wave absorber on a lower surface of a lid in the following respect: the physical distance between the conductor layer 23B and the electronic component 4 is increased such that the electronic component 4 is less influenced in terms of its operating frequency by the conductor layer 23B, and as a result, the electronic component 4 can operate in a stable manner.

The conductor layer 23B eliminates or reduces the occurrence of cavity resonance or, more specifically, resonant oscillation in the housing space 33.

The conductor layer 23B includes an opening 23Bh and a first part 23Bc. The opening 23Bh is located in a midsection and is surrounded with the first part 23Bc. The midsection is a region including the center of the lid 2B in a see-through plan view.

A dielectric layer includes a second part 27B, the first dielectric layer 24, and the second dielectric layer 25. The second part 27B is located in the opening 23Bh. The second part 27B and the first dielectric layer 24 extend continuously in a manner so as to constitute a single piece. More specifically, the second part 27B, that is, part of the first dielectric layer 24 or part of the second dielectric layer 25 is caught in the opening 23Bh of the conductor layer 23B when the conductor layer 23B and the dielectric layer concerned (the first dielectric layer 24 or the second dielectric layer 25) are stacked.

Figure 7:
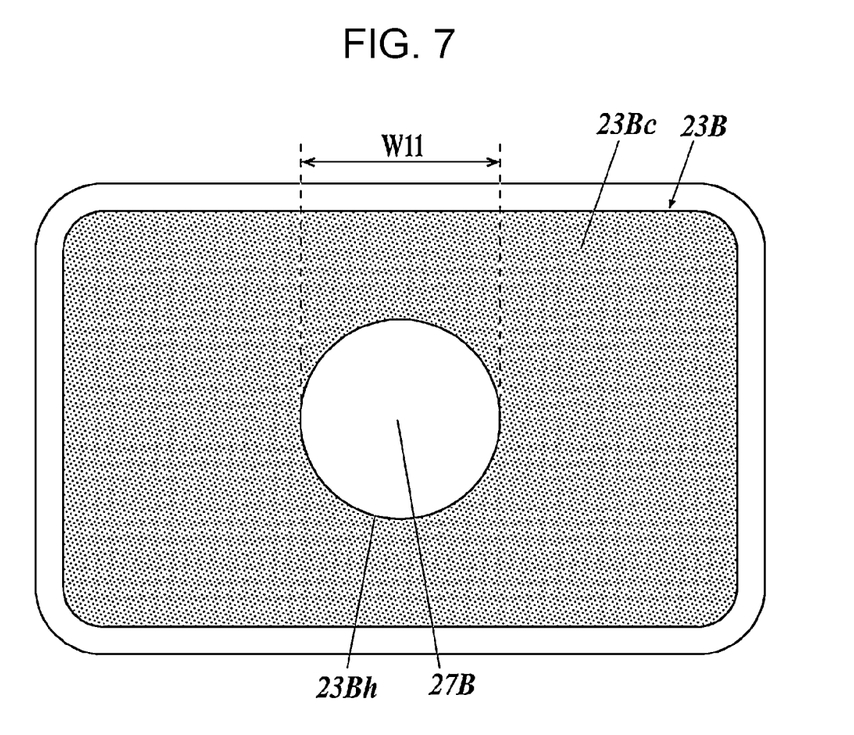
FIG. 7 is a plan view of a layer included in the lid, with a conductor layer in FIG. 1 being located in the layer.

As illustrated in FIG. 7, which is a see-through plan view of the conductor layer 23B, W11 denotes the width of the opening 23Bh of the conductor layer 23B. W1 may be more than or equal to $\lambda/2$ and less than or equal to $3\lambda/2$, where $\lambda$ is the radio wavelength at which the electronic component operates. When these design requirements are met, spurious waves from the electronic component disposed inside the package can be transmitted through the opening 23Bh of the conductor layer 23B and can escape to the outside such that the spurious waves will be less likely to stay in the housing space 33. The occurrence of cavity resonance will be reduced accordingly.

The opening 23Bh of the conductor layer 23B may be circular, as illustrated in FIG. 7. In the case where the opening 23Bh of the conductor layer 23B is circular, spurious waves can escape to the outside in an efficient manner. The opening 23Bh of the conductor layer 23B may be located in the midsection of the lid 2B; that is, the opening 23Bh may be located above the housing space 33. Providing the opening 23Bh above the housing space 33 is conducive to reducing the occurrence of cavity resonance in the housing space 33. Providing only one opening 23Bh rather than two or more openings 23Bh of the conductor layer 23B enables a reduction in the occurrence of dielectric resonance such that the occurrence of cavity resonance in the housing space 33 will be reduced accordingly.

As illustrated in FIG. 7, the first part 23Bc of the conductor layer 23B may extend from the outer edge of the opening 23Bh, in which the second part 27B is embedded, to a peripheral portion of the dielectric layer (the first dielectric layer 24 and the second dielectric layer 25). In this case, the first part 23Bc of the conductor layer 23B lies above an aperture surface at an upper end of the housing space 33, with the second part 27B being embedded in the opening 23Bh of the conductor layer 23B.

The thickness of the second dielectric layer 25 lying on the underside of the conductor layer 23B may be more than $\lambda/16$ and less than or equal to $\lambda/4$, where $\lambda$ is the radio wavelength at which the electronic component 4 operates. In the case where these design requirements are met, the occurrence of dielectric resonance inside the lid 2B will be further reduced. In the case where the thickness of the second dielectric layer 25 is more than $\lambda/16$, the electronic component is less affected in terms of its operating frequency by the conductor layer 23B, and a standing wave is less likely to develop in the lid 2B.

Likewise, the thickness of the first dielectric layer 24 lying on the top of the conductor layer 23B may be more than $\lambda/16$ and less than or equal to $\lambda/4$, where $\lambda$ is the radio wavelength at which the electronic component 4 operates. In the case where these design requirements are met, the occurrence of dielectric resonance inside the lid 2B will be further reduced. In the case where the thickness of the first dielectric layer 24 is more than $\lambda/16$, a certain level of resistance to mechanical pressure from the outside is maintained, and a standing wave is less likely to develop in the lid 2B. The thickness of the dielectric layers included in the lid 2B may be adjusted as follows: the thickness of the second dielectric layer 25, which is physically closer than the other dielectric layer to the electronic component and can thus influence the electronic component significantly, is more than $\lambda/16$ and less than or equal to $\lambda/4$, and the first dielectric layer 24 is thicker than the second dielectric layer 25. The thickness of the first dielectric layer 24 may be more than $\lambda/4$.

Figure 8:
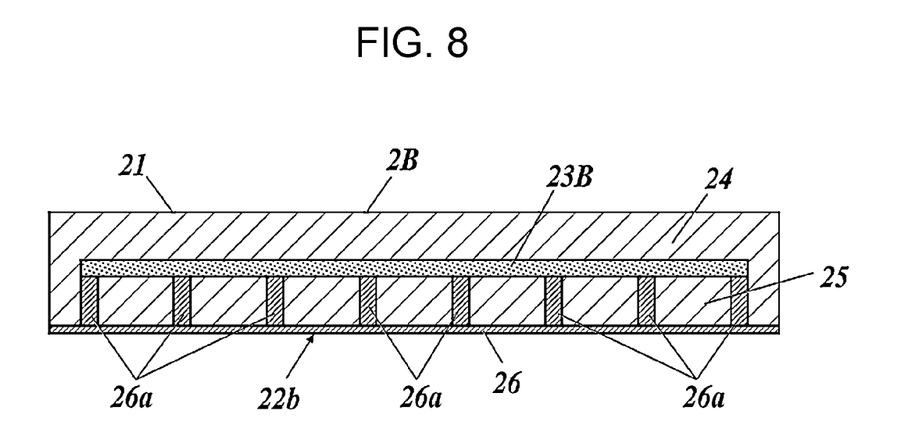
FIG. 8 is a longitudinal sectional view of a peripheral portion of the lid according to Embodiment 2 of the present disclosure.

The second dielectric layer 25 may include a contact conductor 26, which is connected to the first part 23Bc of the conductor layer 23B and extends in the up-and-down direction. The contact conductor 26 may be made of an electrically conductive material, such as tungsten. The contact conductor 26 may be a via for conduction of electricity between an upper layer and a lower layer. The contact conductor (metal film) 26 electrically connected to the conductor layer 23B may be exposed at a surface of the lid 2B. In the example illustrated in FIGS. 5 and 8, the contact conductor 26 is exposed at the seal area 22b in the lower surface peripheral portion of the lid 2B. As illustrated in FIG. 8, the contact conductor 26 includes through portions 26a, which extend through the second dielectric layer 25. In a see-through plan view, more than one through portion 26a may be provided in a manner so as to be located in the lower surface peripheral portion of the second dielectric layer 25, with a spacing being provided between adjacent ones of the through portions 26a. The spacing between adjacent ones of the through portions 26a is more than zero and less than or equal to $\lambda/4$, where $\lambda$ is the radio wavelength at which the electronic component operates. In other words, more than one through portion 26a may be provided in a manner so as to be located in the seal area 22b in the lower surface peripheral portion when viewed in the up-and-down direction, with a spacing of $\lambda/4$ or less being provided between adjacent ones of the plurality of through portions 26a. This layout enables the lid 2B to produce an improved shielding effect, which in turn reduces spurious emission outside the opening 23Bh located in the midsection. A metal film electrically connected to ground wiring is placed on the upper surface peripheral portion 32a of the electronic component-housing base 3. The lid 2B is brazed to the electronic component-housing base 3 such that the conductor layer 23B is electrically connected to the ground wiring of the electronic component-housing base 3.

While the electronic device 10B is in operation, the conductor layer 23B is electrically connected to the ground such that spurious waves absorbed in the conductor layer 23b are allowed to escape to the ground. The constancy of radio-frequency characteristics is achieved accordingly.

The first part 23Bc of the conductor layer 23B may be made of tungsten or molybdenum.

The adoption of the lid 2B in Embodiment 2 offers the following advantages: spurious waves are allowed to escape to the outside through the opening 23Bh located only in the midsection of the conductor layer 23B in the lid 2b and are thus prevented from staying in the cavity such that cavity resonance and dielectric resonance inside the lid 2B are suppressed; and the electronic component 4 can operate in a stable manner, with the lid 2B having little influence on the electronic component 4.

The conductor layer 23B is sandwiched between the first dielectric layer 24 and the second dielectric layer 25 and is held inside the lid 2B such that the conductor layer 23B is protected from damage, erosion, and the like. Thus, selections can be made from a variety of conductor materials for the conductor layer 23B.

It can thus be easily ensured that the lid has favorable characteristics in relation to radio waves. For example, the lid has the aforementioned ability to prevent or reduce the occurrence of resonance.

Method for Manufacturing Electronic Component-Housing Package and Electronic Component-Housing Base The lid 2B and the electronic component-housing base 3 are formed separately. The electronic component-housing base 3 in the present embodiment can be manufactured in much the same way as the electronic component-housing base 3 in Embodiment 1. The lid 2B can be manufactured in much the same way as the lid 2A in Embodiment 1 except that the conductor layer 23B is formed in place of the electrical resistance layer 23A of the lid 2A in Embodiment 1.

Embodiments of the present invention have been described so far. The material, shape, and size of each part of the lid and those of each part of the electronic component-housing base as well as other details mentioned in the embodiments and details illustrated in the accompanying drawings may be changed as appropriate.

INDUSTRIAL APPLICABILITY

The present disclosure is applicable to a lid, an electronic component-housing package, and an electronic device.

REFERENCE SIGNS LIST 1A, 1B electronic component-housing package
2A, 2B lid 3 electronic component-housing base
4 electronic component
10A, 10B electronic device
21 upper surface
22 lower surface
22a middle surface
22b seal area (lower surface peripheral portion)
23A electrical resistance layer
23B conductor layer
23Ac, 23Bc first part
23Ah, 23Bh opening
24 first dielectric layer
25 second dielectric layer
27A, 27B second part
26 contact conductor
34 mounting part
W1, W11 opening width
W2 line width

The invention claimed is:

1. A lid of an electronic component-housing package, the lid comprising:
   a conductor layer including at least one opening and a first part surrounding the at least one opening; and
   a dielectric layer including a first dielectric layer, a second dielectric layer, and a second part between the first dielectric layer and the second dielectric layer,
   the first dielectric layer lying on a top of the conductor layer, the second dielectric layer lying on an underside of the conductor layer, the second part being located in the at least one opening.

2. The lid according to claim 1, wherein
   the conductor layer is an electrical resistance layer,
   the at least one opening comprises a plurality of openings,
   the first part is linear and surrounds the plurality of openings, and
   the second part is located in the plurality of openings.

3. The lid according to claim 2, wherein the first part has a mesh pattern.

4. The lid according to claim 2, wherein in a see-through plan view, an opening width of the at least one opening is greater than a line width of the first part and is less than or equal to $\lambda/4$, where $\lambda$ is a radio wavelength at which an electronic component operates.

5. The lid according to claim 2, wherein the first part contains ruthenium oxide or tungsten.

6. The lid according to claim 2, wherein the first part contains carbon.

7. The lid according to claim 2, wherein a sheet resistance of the first part is in a range of 20 to 100 $\Omega/sq$.

8. The lid according to claim 1, wherein in a see-through plan view, the at least one opening is located in a midsection of the conductor layer.

9. The lid according to claim 8, wherein in a see-through plan view, the at least one opening is circular.

10. The lid according to claim 8, wherein in a see-through plan view, an opening width of the at least one opening is more than or equal to $\lambda/2$ and less than or equal to $3\lambda/2$, where $\lambda$ is a radio wavelength at which an electronic component operates.

11. The lid according to claim 8, wherein the first part extends from an outer edge of the at least one opening to a peripheral portion of the dielectric layer.

12. The lid according to claim 1, wherein a thickness of the second dielectric layer is more than $\lambda/16$ and less than or equal to $\lambda/4$, where $\lambda$ is a radio wavelength at which an electronic component operates.

13. The lid according to claim 1, wherein a thickness of the first dielectric layer is more than $\lambda/16$ and less than or equal to $\lambda/4$, where $\lambda$ is a radio wavelength at which an electronic component operates.

14. The lid according to claim 1, wherein the first dielectric layer is thicker than the second dielectric layer.

15. The lid according to claim 1, wherein
   the dielectric layer includes a contact conductor that is electrically connected to the first part and that extends in an up-and-down direction, and
   the contact conductor is exposed at a lower surface of the second dielectric layer.

16. The lid according to claim 15, wherein the contact conductor is exposed at a peripheral portion of the lower surface.

17. The lid according to claim 15 or 16, wherein
   the contact conductor includes a plurality of through portions that extend through the second dielectric layer,
   in a see-through plan view, the plurality of through portions are located in a lower surface peripheral portion of the second dielectric layer, with a spacing being provided between adjacent ones of the plurality of through portions, and
   the spacing is less than or equal to $\lambda/4$, where $\lambda$ is a radio wavelength at which an electronic component operates.

18. An electronic component-housing package, comprising:
   the lid according to claim 1; and
   an electronic component-housing base including a mounting part and an upper surface peripheral portion for joining with a lower surface peripheral portion of the lid, the mounting part being a mounting place for an electronic component and being surrounded with the upper surface peripheral portion.

19. An electronic device, comprising:
   the electronic component-housing package according to claim 18; and
   an electronic component mounted on the mounting part.

* * * * *